(12) United States Patent
Movchan et al.

(10) Patent No.: US 7,042,145 B2
(45) Date of Patent: May 9, 2006

(54) ELECTRON BEAM PROJECTOR PROVIDED WITH A LINEAR THERMIONIC EMITTING CATHODE FOR ELECTRON BEAM HEATING

(75) Inventors: Boris A. Movchan, Kiev (UA); Oleg Ja. Gavriljuk, Kiev (UA)

(73) Assignee: International Center for Electron Beam Technologies of E.O. Paton Electric Welding Institute, Kiev (UA)

( * ) Notice: Subject to any disclaimer, the term of this patent is extended or adjusted under 35 U.S.C. 154(b) by 240 days.

(21) Appl. No.: 10/451,853

(22) PCT Filed: Dec. 26, 2001

(86) PCT No.: PCT/UA01/00050

§ 371 (c)(1),
(2), (4) Date: Dec. 17, 2003

(87) PCT Pub. No.: WO02/052611

PCT Pub. Date: Jul. 4, 2002

(65) Prior Publication Data

US 2004/0090167 A1 May 13, 2004

(30) Foreign Application Priority Data

Dec. 26, 2000 (UA) .............................. 2000127516

(51) Int. Cl.
*H05H 1/00* (2006.01)
(52) U.S. Cl. .............................. 313/361.1; 313/360.1; 313/362.1; 313/363.1; 118/723 HC
(58) Field of Classification Search ........... 313/360.01, 313/361.01, 362.01, 363.01; 118/723 HC
See application file for complete search history.

(56) References Cited

U.S. PATENT DOCUMENTS

| | | | |
|---|---|---|---|
| 3,976,908 A | 8/1976 | Redel | |
| 4,034,256 A | 7/1977 | Sommerkamp et al. | |
| 4,061,871 A | 12/1977 | Sommerkamp et al. | |
| 4,105,890 A | 8/1978 | Movchan et al. | |
| 4,126,811 A | 11/1978 | Movchan et al. | |
| 4,143,272 A | 3/1979 | Frank | |
| 4,803,398 A | 2/1989 | Kraft et al. | |
| 4,998,004 A | 3/1991 | Lawrence et al. | |
| 5,416,381 A | 5/1995 | Scarpetti, Jr. et al. | |
| 5,686,785 A | 11/1997 | Movchan et al. | |

FOREIGN PATENT DOCUMENTS

| | | |
|---|---|---|
| EP | 0 410 596 A2 | 1/1991 |
| RU | 2084986 C1 | 7/1997 |
| RU | 2169043 C2 | 12/2000 |
| UA | 1360490 A | 8/1997 |

*Primary Examiner*—Mariceli Santiago
*Assistant Examiner*—Anthony Perry
(74) *Attorney, Agent, or Firm*—Young & Thompson

(57) ABSTRACT

An electron beam gun comprises a beam waveguide and an accelerating anode fixed thereto. The accelerating anode is connected with the aid of high-voltage insulators and through a cathode plate to a cathode assembly. The cathode assembly comprises a linear hot cathode fixed with the aid of two cathode carriers and a focussing electrode which is coaxially arranged with respect to the linear hot cathode and encompasses it with the aid of a two-sided surface. The beam waveguide is separated from the accelerating anode with the aid of rack panels which rigidly fix the accelerating anode to the beam waveguide in such a way that a space is formed therebetween. In order to hermetically separate cathode and anode parts of the projector, the accelerating anode is provided with a plate rigidly connected thereto.

3 Claims, 2 Drawing Sheets

ELECTRON BEAM PROJECTOR PROVIDED WITH A LINEAR THERMIONIC EMITTING CATHODE FOR ELECTRON BEAM HEATING

FIELD OF THE INVENTION

The invention pertains to apparatuses of electron beam technology, or more specifically to electron guns for electron beam heating, melting and evaporation of materials in vacuum or reactive gas atmosphere.

PRIOR ART

Electron guns with a linear hot cathode of 100–150 kW power have small dimensions, are convenient in operation and are widely used in production electron beam units for various applications and described in article by B. A. Movchan, V. A. Timashov. "Plane Beam Electron Guns for Melting and Evaporation of Materials", in the book "Refining Remelting", K., Naukova Dumka, 1975, pp. 131–139; in the book by G. B. Stroganov, V. M. Chepkin, V. S. Terentjeva "High-temperature Resistant Coatings for Gas Turbines", M., "Navigator-extra" Publ. House, 2000.

Production electron beam units are widely used for producing various coatings and materials both in vacuum environment and in reactive gas environment.

Known are electron guns with a linear hot cathode, developed by E.O. Paton Electric Welding Institute of the NAS of Ukraine (U.S. Pat. No. 3,814,829, 1974, IPC N05b 7/00; USSR Auth. Cert. #686158, 1979, IPC B 05 B 7/00, H01J 3706; U.S. Pat. No. 4,105,890, 1978, IPC B23K 9/00; Patent of Ukraine #21440A, 1997, IPC H01J 29/46, 29/48). They are capable of deflecting the beam by 25–45 degr., being located at a considerable distance from materials being heated and in separate gun chambers, which have individual pumping down means. This enables their successful application in production electron beam units, both for working in a vacuum environment and in a reactive gas environment.

The main problem in the majority of known guns with a linear hot cathode is a short duration of continuous gun operation without hot cathode replacement in the reactive gas environment, insufficient stability of the specified parameters of the electron beam on the surface of materials being heated during long-term operation of the gun.

A short duration of continuous operation of the gun with a linear hot cathode in the reactive gas environment is due to intensive ion bombardment of the linear hot cathode, resulting from ionisation of the gas flow, which is the most pronounced in operation at a high pressure of reactive gases.

Ion bombardment leads to local overheating, sputtering of the linear hot cathode surface, which results in its service life becoming much shorter.

Designs of axial guns, which allow solving the problems of extending the cathode service life, are known and described in the book by Z. Shiller, W. Geising, Z. Paptser, "Electron Beam Technology", transl. From German, M, "Energia", 1980. For guns with a linear hot cathode this problem is still unsolved.

Insufficient stability of the specified parameters of the electron beam on the surface of materials, which are heated, is due to unstable position of the linear hot cathode relative to the focusing electrode, because of heating of fixture parts and tension of linear hot cathode.

Change of the linear hot cathode position relative to focusing electrode leads to a change in the convergence of the electron beam, which results in a change of specific power of the beam in the focal spot.

Such changes in the gun operation impair the stability and the reproducibility of the processes of heating, melting and evaporation of materials.

In the known most perfect designs of electron guns with a linear hot cathode, developed by E.O. Paton Electric Welding Institute (U.S. Pat. No. 3,814,829, 1974; USSR Auth. Cert. #686158, 1979; U.S. Pat. No. 4,105,890, 1978, Ukrainian Patent #21440A, 1997), an accelerating anode is used, which is fastened directly on the beam guide and cathode unit, which contains one linear hot cathode, heated by electric current flowing through it, and special fastening and tension devices provide current supply and tension of the linear hot cathode during the gun operation.

Known is the electron gun with a linear hot cathode, described in U.S. Pat. No. 4,126,811, 1978, IPC H01J 29/46, H01J 29/48. Electron gun contains an accelerating anode, connected to cathode assembly by high-voltage insulators. Cathode assembly includes a linear hot cathode, fastened in cathode-holders on the case and positioned co-axially with the focusing electrode. One face side of the hot cathode is turned towards the accelerating anode, the other is positioned with a gap relative to the focusing electrode, which encloses the hot cathode by a two-face surface. Focusing electrode is made in the form of two parts, mounted with a gap. The ends of two flat springs are fastened to the opposite end faces of these parts; other ends of the springs are connected to a terminal current supply for feeding the filament current. The ends of two more flat springs are fastened in cathode holders to the other ends faces of the parts, these ends being electrically coupled to current supplies and fastened on the insulator of the cathode assembly casing. Such design of the gun does not provide a high reproducibility or stability of the position of the linear hot cathode relative to the focusing electrode, because of the difficulties of precise fixing with screw joints the relative position of the two parts of the focusing electrode and linear hot cathode, and in heating of the gun parts during long-term operation. It does not solve the problem of extending the service life of the linear hot cathode.

Known is an electron beam gun described in U.S. Pat. No. 4,105,890, 1978, IPC B23C 9/00, which allows deflecting the electron beam by an up to 45 degr. angle, by using additional focusing coils in the gun beam guide part. This improves the protection of the linear hot cathode and the focusing electrode from penetration of direct vapour flows of materials, which evaporate, but does not solve the problem of stability of the linear hot cathode position relative to the focusing electrode or reducing ion bombardment of the linear hot cathode.

Known is an electron gun with a linear hot cathode, described in the Ukrainian application for invention #97074063, IPC H0J 29/46, 29/48, 37/04 ("Promyslova Vlastnist" Bulletin #8(1), 1999). Electron gun contains the anode and cathode assemblies, connected by a high-voltage insulator. Anode assembly contains the anode, fastened directly on the beam guide, which is made in the form of a cylinder of a non-magnetic material, and a deflecting system of a circular magnetic core. Cathode assembly contains: case; flat insulator built into the case; linear hot cathode, which is fastened on the case, using two cathode-holders, one of which is hinged to the case via a flat insulator; focusing electrode with a terminal current supply for feeding a regulated potential negative relative to the coaxially-mounted linear hot cathode. Springs, which provide the tension of the linear hot cathode, are located at a distance from the hot cathode radiation surface and are not current-coonducting. In the claimed design of the gun the position of linear hot cathode relative to the focusing electrode is determined by the accuracy of making the parts, which may be insufficient in view of the hinged nature of fastening and long arm to the point of cathode location. In addition, in service, as well as a result of the part heating during long-term continuous operation of the gun, the hinge fastening of the cathode will become weaker and the stability of position of the linear hot cathode, mounted on the long arm relative to the focusing electrode, will be even lower. Such a design of the gun does not solve the problem of reducing the intensity of ion bombardment in operation with reactive gas bleeding.

The closest one in engineering terms to the claimed invention is the electron beam gun with a linear hot cathode, described in the Ukrainian patent for invention #21440A, 1997, IPC H01J 29/46, 29/48, by B. A. Movchan, V. A. Timashov, E. L. Piyuk, taken as the closest prior art. Electron beam gun incorporates: beam guide, accelerating anode, connected by high-voltage insulators to the cathode assembly. The anode is fixed directly on the beam guide. Cathode assembly incorporates the frame, flat insulator, two cathode-holders and focusing electrode. One cathode-holder is rigidly fixed to the frame by a current-conducting plate. The second cathode-holder via a pair of current-conducting springs, and the focusing electrode by a hard post, are fastened to the flat insulator, which is built into the frame. Focusing electrode, installed co-axially with the linear hot cathode, enclosing it by a two-face surface, is connected to the terminal for feeding the focusing voltage. Pairs of flat current-conducting springs for fastening one cathode-holder and a plate for fastening the second cathode holder, have elongated holes for the hot cathode adjustment relative to the focusing electrode. This design of the electron beam gun is characterised by an unstable position of the linear hot cathode relative to the focusing electrode, which is due to different conditions of fastening of its ends. Current-conducting strings and post, by which the linear hot cathode is fastened, have different weight, are made of different materials and during heating expand to different lengths. Adjustment of the position of the linear hot cathode relative to the focusing electrode before the start of the gun operation, does not provide its stable position during long-term operation of the gun at different powers of the electron beam. In addition, non-uniform heating of different sides of the long, located close to the edge of the focusing electrode fastening post occurs during long-term operation of the gun. This leads to its bending out and angular shifting of the focusing electrode relative to the linear hot cathode. Applying a potential, negative relative to the linear hot cathode, to the focusing electrode, improves the focusing of the electron spot to a smaller degree, than deterioration of focusing, caused by unstable position of the linear hot cathode relative to the focusing electrode. In addition, when a potential, negative relative to the linear hot cathode, is applied to the focusing electrode, the electron beam current decreases. Its restoration requires increasing the temperature of heating of the linear hot cathode, which leads to shortening of its life. This design of the gun also does not solve the problem of reducing the ion bombardment of the hot cathode in operation with reactive gas bleeding.

THE INVENTION ESSENCE

This invention is aimed at solving the problem of creating such a design of the electron gun with the linear hot cathode, which would allow:—avoiding the unstable position of the linear hot cathode relative to the focusing electrode, caused by heating of gun parts during long-term operation, by symmetrical arrangement and making of the parts for fastening, current supply and tension of the linear hot cathode to be the same from both ends of the linear hot cathode; —reducing ion bombardment of the linear hot cathode by removing the accelerating anode from the beam guide and introducing additional high-vacuum pumping down of the anode-beam guide gap.

This aim is achieved by proposing an electron gun with a linear hot cathode for electron beam heating, which incorporates a beam guide with an accelerating anode, fastened to it, which is connected by high-voltage insulators via a cathodic plate to the cathode assembly, which incorporates linear hot cathode, fastened in two cathode holders, and focusing electrode, co-axially positioned and enclosing the linear hot cathode by a two-face surface, in which, according to the invention, the beam guide is separated from the accelerating anode, using posts, providing a rigid fixing of the accelerating anode to the beam guide and creation of a space between them, the accelerating anode incorporating a rigidly fastened to it plate for vacuum-tight separation of the cathode and beam-guide parts of the gun, and the cathode assembly incorporating two similar current supplies, fastened via ring insulators on the focusing electrode and connected by flat springs and parallel to them copper current-conducting plates with cathode holders, the cathode assembly being made and fastened on the cathodic plate, symmetrical relative to the vertical axis of the focusing electrode.

It is rational to mount under the ring insulators, by which the current supplies are fastened to the focusing electrode, the calibrated gaskets, which will allow regulation of the height of the linear hot cathode mounting relative to the focusing electrode.

It is rational to make the holes in the current supplies for mounting the ring insulators with tolerance, which enables adjustment of the position of the linear hot cathode relative to the focusing electrode in the horizontal plane.

In electron guns with a linear hot cathode, the plane-parallel electron beam, formed by the electric field in the cathode-anode space, diverges after passing through the anode slot. Therefore, anode removal from the beam guide leads to increase of the dimensions of electron beam, which enters the beam guide and deterioration of the electron-optical parameters of the gun. However, when working with deflection of electron beam, normally used in electron beam units, the scattered magnetic field of the deflection system of the beam guide penetrates beyond its case and has a focusing impact on the electron beam in the direction of the anode. The diverging? electron beam reduces the angle of divergence, which allows removing the anode from the beam guide to a distance of 70–80 mm without any noticeable deterioration of electron-optical parameters of the gun. This distance is sufficient to implement additional high-vacuum pumping down of the space between the anode and beam guide.

The claimed design allows improvement of the stability of electron-optical parameters during long-term operation of the gun, and extension of the duration of continuous operation of the gun, both in vacuum environment and in the reactive gas atmosphere.

BRIEF DESCRIPTION OF DRAWINGS

The invention is explained in a detailed description with reference to the appended drawings.

DETAIL DESCRIPTION OF THE INVENTION

Figure 1:
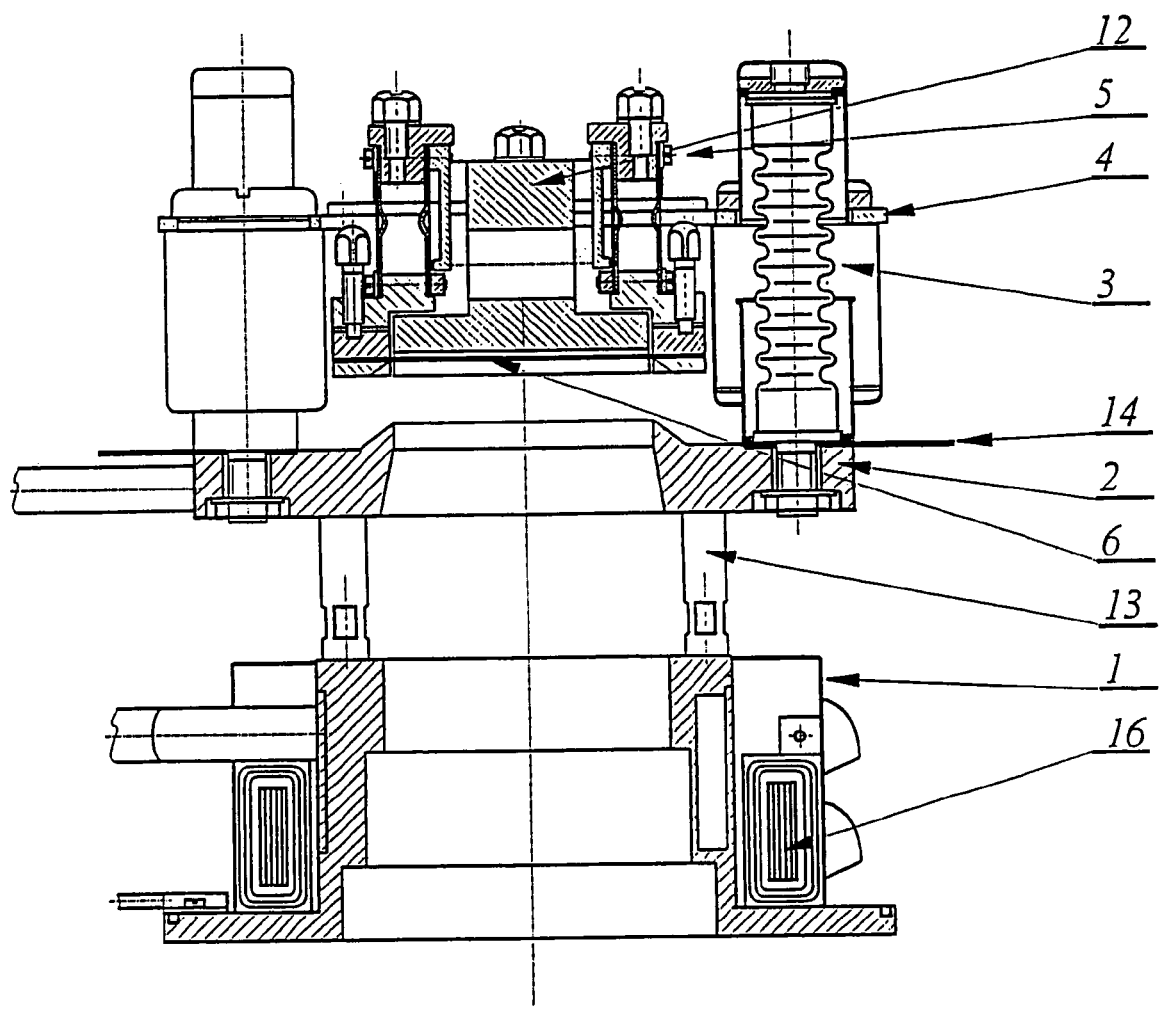
FIG. 1—General view of the electron gun with a linear hot cathode for electron beam heating, according to the invention, cut-away drawing.

The claimed electron gun with a linear hot cathode for electron beam heating consists of beam guide 1, which incorporates deflection system 16, and to the case of which accelerating anode 2 is fastened by posts 13, which incorporates plate 14, which separates the cathode and beam parts of the electron gun, and which is connected by high-voltage insulators 3 through cathodic plate 4 to cathode assembly 5 (FIG. 1).

Figure 2:
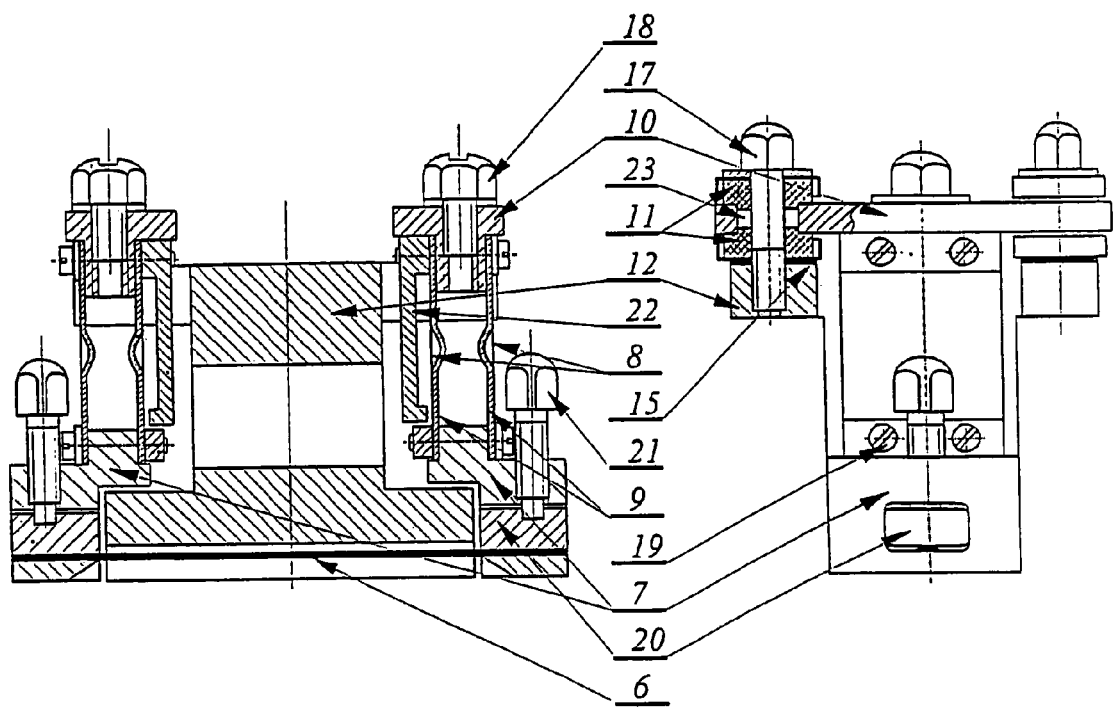
FIG. 2—Cathode assembly of electron gun with the linear hot cathode for electron beam heating, according to the invention, cut-away drawing.
Figure 2:
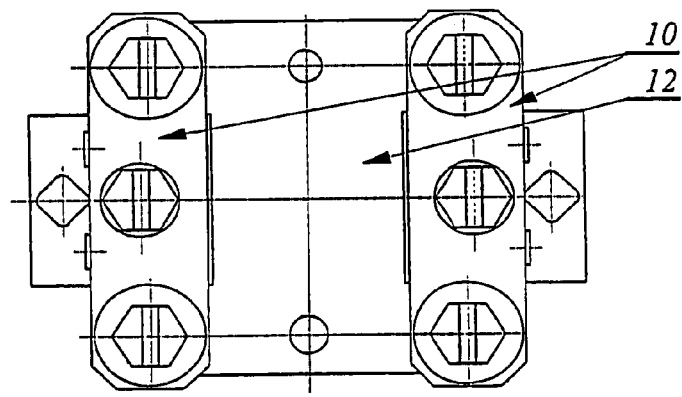

Cathode assembly (FIG. 2) consists of focusing electrode 12, to which two current supplies 10 are fastened by retainer screws 17 through ring insulators 11, with terminals 18 for applying filament voltage to linear hot cathode. Linear hot cathode 6 is fastened in cathode-holders 7, connected to current supplies 10 by screw joints 19 through a system of tension and current supply, which consists of copper plates 9 and flat springs 8. Linear hot cathode 6 is fixed in cathode-holders 7 by insert 20, using screws 21. Limiting posts 22 are mounted to prevent possible short-circuiting of filament voltage of linear hot cathode. Holes in current supplies 10 to accommodate ring insulators 11 are made with an allowance for horizontal adjustment of the position of cathode holders 7 with linear hot cathode 6 fastened in them relative to focusing electrode 12. The height of the linear hot cathode positioning relative to the focusing electrode may be adjusted by the number of calibrated gaskets 15 under ring insulators 11.

As it is seen from appended drawings and the above description, in the claimed design of electron gun with a linear hot cathode, unlike the actual prototype design, the assemblies for fastening both the ends of the linear hot cathode and applying filament voltage to them are made to be the same and symmetrically located relative to the focusing electrode, the anode is removed from the beam guide system to the distance, which is determined by the height of the fastening posts, and the separating plate allows vacuum-tight separation of the gun cathode part from its beam guide part.

The above device operates as follows.

When the gun of the claimed design is mounted in the electron beam unit, it is necessary to separate by a shield, which is fastened on separating plate 14, the cathode part of the chamber, accommodating the gun, from the beam guide part and set up separate high-vacuum pumping of both parts of the chamber. Total cross-section of open holes between the main chamber and the beam guide part of the gun chamber is larger, than that between the two parts of the gun chamber, so that the capacity of the means of high-vacuum pumping of the beam guide part of the chamber should be higher than of those for the cathode part.

When voltage from the filament source is applied to terminals 18 of current supplies 10 (FIG. 2), filament current, passing through current-carrying copper plates 9, cathode-holders 7 and linear hot cathode 6, heats it to the temperature, at which electron emission is observed. The linear cathode becomes longer. Flat molybdenum springs 8 apply a longitudinal tensile force to linear hot cathode and at its elongation allow maintaining the hot cathode linearity and its position relative to focusing electrode 12. Change of the dimensions of current supplies, flat springs, cathode holders, resulting from gun heating during long-term operation, is the same at both ends of linear hot cathode, so that the position of linear hot cathode relative to the focusing electrode is more stable in the claimed gun than in the closest prior art design.

Specified position of linear hot cathode 6 relative to focusing electrode 12, required for optimal mode of gun operation, is provided at the assembly stage by adjustment of the position of current supplies 10 and by their fastening with screws 17, as well as by selection of the number of calibrated gaskets 15 under ring insulators 11. If required, a potential negative relative to the potential of linear hot cathode is applied to focusing electrode 12 for final focusing of the focal spot.

On the whole, the claimed electron beam gun provides a longer continuous operation, higher stability of electron-optical parameters, which essentially improves the stability and reproducibility of the technological processes of melting and evaporation of various materials. The greatest effect from application of the claimed electron gun is manifested in the cases, requiring long continuous operation of the gun and high stability of its electron-optical parameters. Application of the claimed gun is particularly important, when conducting the processes of melting and evaporation in the reactive and inert gas atmosphere.

What is claimed is:

1. Electron gum with a linear hot cathode for electron beam heating, which comprises a beam guide (1) with an accelerating anode (2) fastened on it, wherein the anode is connected to high-voltage insulators (3) through a cathodic plate (4) with a cathode assembly (5), wherein the cathode assembly comprises a linear hot cathode (6), fastened in two cathode-holders (7), and a focusing electrode (12), mounted co-axially and enclosing said linear hot cathode (6) by a two-face surface, characterized in that said beam guide (1) is separated from said accelerating anode (2) by posts (13), providing a rigid fastening of the accelerating anode on the beam guide and creation of a space between them, said accelerating anode incorporating a plate (14) rigidly connected to it for a vacuum-tight separation of the cathode and the beam guide part of the gun, and the cathode assembly (5) incorporating two similar current supplies (10) fixed to said focusing electrode (12) through ring insulators (11) and connected to the cathode-holders (7) by means of four flat springs (8) and copper current-conducting plates (9) that are located parallel to the flat springs (8), the cathode assembly (5) being made and fastened on the cathode plate 4 symmetrically relative to a vertical axis of focusing electrode (12).

2. Electron gun according to claim 1, characterized in that it further comprises calibrated gaskets (15) located under the ring insulators (11) of the current supplies (10) mounted on the focusing electrode (12) to enable adjustment of the height of the linear hot cathode (6) relative to the focusing electrode (12).

3. Electron gun according to claim 1, characterized in that the current supplies (10) contain holes (23), made with tolerance with respect to the ring insulators to enable adjustment of the position of the linear hot cathode (6) relative to the focusing electrode (12) in the horizontal plane.

* * * * *